(12) United States Patent
DeVore et al.

(10) Patent No.: US 6,521,896 B1
(45) Date of Patent: Feb. 18, 2003

(54) BLANKER ASSEMBLY EMPLOYING DIELECTRIC MATERIAL

(75) Inventors: William J. DeVore, Hayward, CA (US); Michael John Penberth, Cambridge (GB)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/586,473

(22) Filed: Jun. 1, 2000

(51) Int. Cl.[7] .......................... H01J 37/147; H01J 37/00
(52) U.S. Cl. ................ 250/396 R; 250/505.1; 250/398; 250/310; 313/361.1
(58) Field of Search .................. 250/396 R, 492.22, 250/492.2, 505.1, 396 ML, 398, 310; 373/361.1

(56) References Cited

U.S. PATENT DOCUMENTS

| | | | |
|---|---|---|---|
| 4,169,229 A | | 9/1979 | Feuerbaum ............. 250/396 R |
| 4,445,041 A | * | 4/1984 | Kelly et al. ............. 250/505.1 |
| 5,276,330 A | * | 1/1994 | Gesley ................... 250/396 R |
| 5,412,218 A | | 5/1995 | Gesley et al. ........... 250/396 R |

* cited by examiner

Primary Examiner—John R. Lee
Assistant Examiner—David A. Vanore
(74) Attorney, Agent, or Firm—Sughrue Mion, LLP.

(57) ABSTRACT

A blanker assembly for an electron beam column obtains synchronicity between the beam blanking signal propagating through its blanker plates and the associated electron beam which is being blanked. Since the blanking signal travels faster than does the electron beam, the desired synchronicity is achieved by use of a dielectric material for propagating the blanking signal to slow down this signal to match the electron beam velocity. By using a dielectric material for high frequency (RF) blanking signals, there will be less signal reflection and greater blanking accuracy because the electron beam is continuously deflected. The blanker plates each include a substance having a relatively low dielectric constant for proipagating the blanking signal between an upper deflection region. The relative slowness of the propagation of the blanking signal between the upper and lower deflection regions provides a delay effect so as to synchronize the blanking signal with the associated electron beam.

8 Claims, 3 Drawing Sheets

BLANKER ASSEMBLY EMPLOYING DIELECTRIC MATERIAL

FIELD OF THE INVENTION

This invention relates to electron beam systems and more specifically to an electron beam blanker for use in electron beam columns.

DESCRIPTION OF THE PRIOR ART

Beam blanking is a required function for electron beam systems used in lithography, testing, metrology, and inspection. In the field of electron beam lithography, the electron beam is switched on and off by deflecting it against an aperture stop (blanking). The deflection is typically accomplished by an electric field between two parallel plates. The plates form a waveguide structure which conducts electromagnetic blanking signals used to define, in part, the pattern to be exposed by effectively switching the beam on and off.

FIG. 1 shows an example of an electron beam column including such a blanker. FIG. 1 is taken from Kelly et al., U.S. Pat. No. 4,445,041, incorporated herein by reference, and uses the same reference numbers as does Kelly. Electrons are provided in the column by a cathode 5 which is a field emission electron source. Cathode 5 is supported above an anode 10 with the anode serving to control and effectively collimate the electron beam. As the electrons move down the column from the anode, they encounter a first lens 15 which serves to focus the beam at the center of a beam blanker 25. Along that path, an alignment deflector/stigmator 20 aligns the beam with the optic axis and stigmates the beam to provide the proper shape before the electrons enter the blanker. Blanker 25 then blanks the beam at the appropriate time to control the exposure when a target 65 at the bottom. A second alignment deflector 30 is also provided to realign the beam after it has passed through blanker 25.

Following realignment, the beam enters a final lens 35 which focuses it onto target 65, the object point of the final lens 35 being the beam cross-over at the center of the blanker. Element 40 is located within its final lens 35, serving as a third alignment deflector and second stigmator. The next element down the column is a dynamic focus coil 45. This serves as a fine focus for beam 60 as it is being deflected to the appropriate location on the target via high speed deflector 50 and a precision deflector 55. Element 70 is an electron scintillator which is connected to a light, pipe and multiplier 75, which are used to accurately monitor the device as it is writing.

FIG. 2, also from Kelly, shows an enlarged view of the blanker 25. This blanker has two characteristic U-shaped plates; the rear plate is only partially visible in this view. The deflector plates 260 are spaced apart by 0.10 inch, each having the general shape of a U and being symmetric top to bottom. Electromagnetic energy (the blanking signal) enters this structure through the two leads at point A, traverses a transition region, travels a length of the U and the top half is reflected around the corner, travels back the length of the U on the bottom half, traverses another transition region and exits the leads at point B. The plates have a constant thickness except in the transition regions 270. Other illustrated dimensions are as indicated in Kelly. There is a knife-edge 280 suspended between the plates by a knife-edge support 290. This is the beam blanking aperture. The electron beam is seen passing between the plates and through the aperture 280. Also provided are mounting holes 271. Angles A1 and A2 are designed to optimize performance.

There is a well-known technical problem in conjunction with such blankers. The RF (radio frequency) blanking signal typically propagates near the velocity of light. This velocity is significantly faster than that of the electron beam. It is to be understood that electron beams have no particular characteristic velocity; the velocity of propagation is dependent on the amount of accelerating energy to which they are subject. Typically, even in a very high voltage electron beam column, electron velocity is no more than 0.4 times the velocity of light. In any case, there is typically a mis-match in velocities due to the electron beam propagating much slower than the blanking signal. This leads to non-ideal beam deflections which in turn cause writing anomalies. This problem is recognized in Kelly and compensated for by providing an electrical path length, which is effectively a delay line, incorporated into the blanker. The transit time of the electromagnetic wave of the blanking signal on this path corresponds approximately to the time for an electron in the beam to transverse the width of the top half of the plates. Thus, an electron in the beam entering the blanker will be subject to substantially the same electric field above the beam cross-over as it is below it but delayed in time.

Thus, Kelly uses the delay line approach to match electron beam velocity with the blanking signal propagation velocity. It is to be understood that any mis-match in these velocities results in focusing problems and hence a less precise image being formed on the target.

Other types of electron beam blankers are shown in Gesley et al., U.S. Pat. No. 5,412,281 and Gesley, U.S. Pat. No. 5,276,330 both also incorporated herein by reference and having structures somewhat similar to those of Kelly.

Feuerbaum, U.S. Pat. No. 4,169,229 also incorporated herein by reference, recognizes the same delay issue but solves it differently. Instead of a U-shaped delay line extending along the deflector plate, Feuerbaum uses a meandering conductor as a delay line and also as the deflector plate. This is shown in present FIG. 3, identical to FIG. 2 of Feuerbaum and having the same reference numbers. Here instead of U shaped deflector plates, the plates are planar and rectangular. Only a single plate of the pair is shown in FIG. 3; the other plate is not shown for simplicity.

The electron beam 15 is shown as a dotted line transiting the plate. The plate includes the interdigital structure 51 which includes a meander shaped conductor track 52 and a screening or shielding conductor track 53. Track 53 is grounded. The conductor track 52 has a (schematically indicated) input connection 521 and an output connection 522 likewise grounded via a terminal resistance 523. A high frequency electromagnetic wave (the blanking signal) enters via the input terminal 521 of the conductor track structure 52 and travels along the meander shape path so as to progress in the direction shown by the arrow 15, delayed in accordance with the extension of the path. The dimensioning of the meander shaped track is determined as a function of the speed of the electron beam which in turn is determined by its accelerating voltage. Kelly indicates that the interdigital structure 51 may be applied to a plate of dielectric material.

Hence, blanking the beam is an electric deflection of the beam caused by two parallel plates that extend parallel to the beam for a distance L and on either side of the beam. A difficulty arises when the blanking signal applied to the plates changes quickly with respect to the electron beam transit time along the length L. Then the fact that the wave (signal) velocity does not match the electron beam velocity causes non-negligible distortions of the electron beam deflection. Feuerbaum addresses this problem by his meandering delay line. The resulting disadvantage is that the beam is only deflected at discrete points of the line, resulting in not much deflection per volt of signal (the deflection sensitivity is low). A secondary disadvantage is that the structure is complex with many bends in the meandering delay line, which may result in wave energy being partially reflected at the bends and thus distorting the waveform.

The Feuerbaum and Kelly approaches thus have been found by the present inventors to have significant drawbacks. Both have problems with high frequency blanking signals in terms of RF propagation and interference. Also, in both cases, the electron beam is subject to rather uneven influences due to the unusual (non-linear) path taken by the blanking signal. Thus, at any one instant, portions of the beam may be subject to a blanking signal of different intensity depending on the position of the blanking signal relative to the beam. That is, the blanking signal at different times is closer or further away from the beam when following its delay path in both Kelly and Feuerbaum.

Therefore, a better match between electron beam propagation and blanking signal propagation would be desirable, especially for high frequency blanking. It is to be understood that over the years the frequency of beam blanking has increased as the throughput speed of electron beam lithography has increased.

SUMMARY

In accordance with this disclosure, an improved delay is provided for an electron beam blanker. As in Feuerbaum, the blanker has a deflector assembly including two parallel deflector plates. However, instead of a meandering conductive path, the delay is provided by propagating the blanking signal between an upper deflection region and a lower deflection region of each deflector plate through a connection region including a substrate having a relatively low dielectric constant. Thus the blanking signal propagates relatively slowly across the connection region between the upper and lower deflection regions, thereby providing the needed delay. The delay path in one embodiment, instead of meandering, is a curve. This use of a dielectric material to slow down propagation of the electromagnetic blanking signal to match the electron beam propagation is advantageous because it reduces RF interference. This results in less reflection and larger deflections per applied volt because the electron beam is continuously deflected rather than discretely deflected as in the Feuerbaum approach by each individual meander turn. Also, it provides continuous in-phase deflection.

In this disclosure, the blanking signal wave is slowed down by a high dielectric-constant material positioned behind, in one embodiment, the deflector plates. When the wave matches the electron beam velocity, the deflector structure can be simply two parallel plates. Since there are two deflection regions with the blanking aperture therebetween reduces the electron beam motion at the target during blanking.

One deflector plate structure in accordance with this disclosure includes a conductive waveguide, which is, e.g., a thin film of gold, formed on a dielectric substrate. At the two deflection regions, respectively at the upper and lower portion of the deflector plate, the underlying substrate has a high dielectric constant. The intervening connection region lying between the upper and lower deflection regions, being formed of a suitable dielectric constant material, functions as a delay line so that the blanking signal arrives at the upper and lower deflection regions in synchronization (in phase) with passage of the slower propagating electron beam. The goal is that when the electron beam is deflected equally by the two deflection regions, the electron beam appears to rock about the blanking aperture. Since the downstream lens, called the objective lens, as described above is focused on this point, the rocking does not cause a shifting of the beam impingement position on the target. This results in optimum exposure definition. As in the prior art, the blanking stop aperture is located halfway between the upper and lower deflection regions, approximately at the rocking point.

Thus the blanking signal electromagnetic wave propagating between the upper and lower deflection regions has a velocity controlled by the preselected configuration of the deflector plate in terms of the dielectric constant of the plate substrate (which is material dependent), the width and length of the conductive waveguide between the upper and lower deflection regions, and the overall geometry of the deflection plate. Thus in order to configure any particular deflector blanking structure, the blanking signal wave velocity is found by theoretical considerations well known to one knowledgeable in the art and the particular configuration of the deflector blanking plates is chosen accordingly.

DETAILED DESCRIPTION

Figure 1:
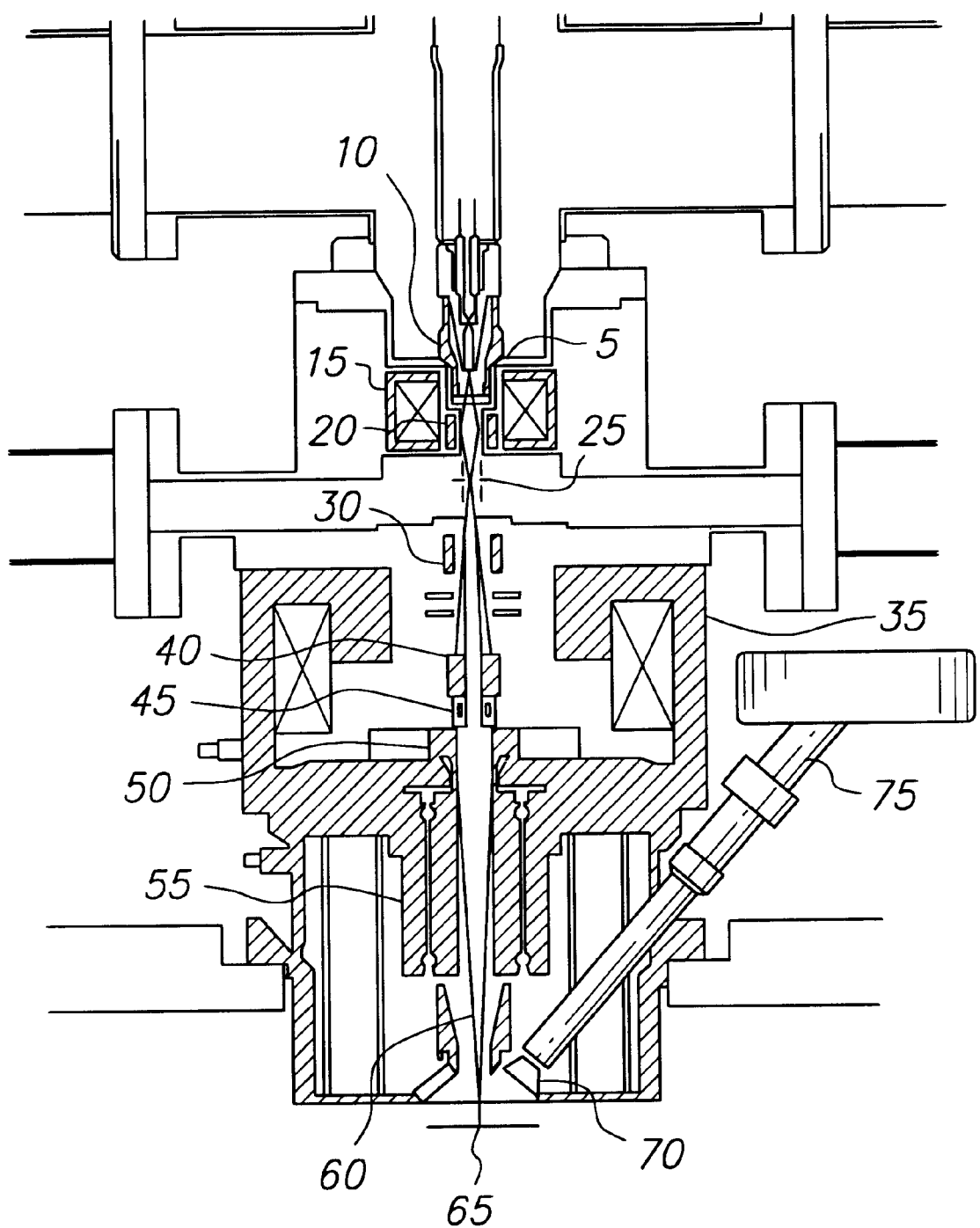
FIG. 1 shows a prior art electron beam column and also one in which the present invention is useful.
Figure 2:
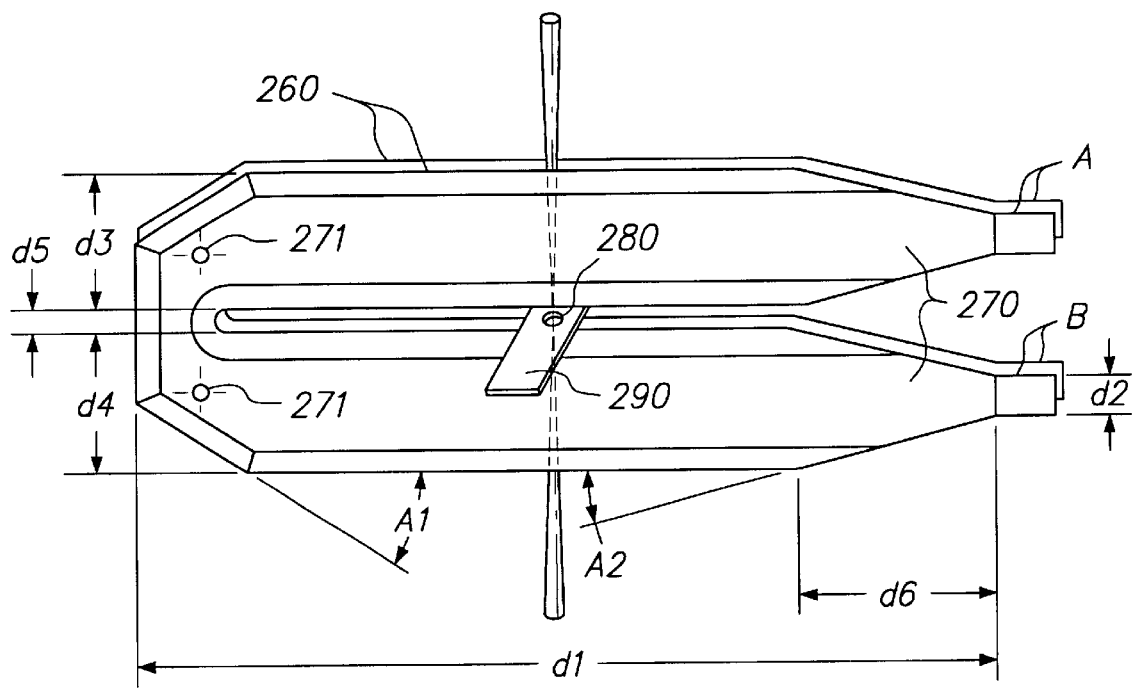
FIG. 2 shows a beam blanker in the prior art.
Figure 3:
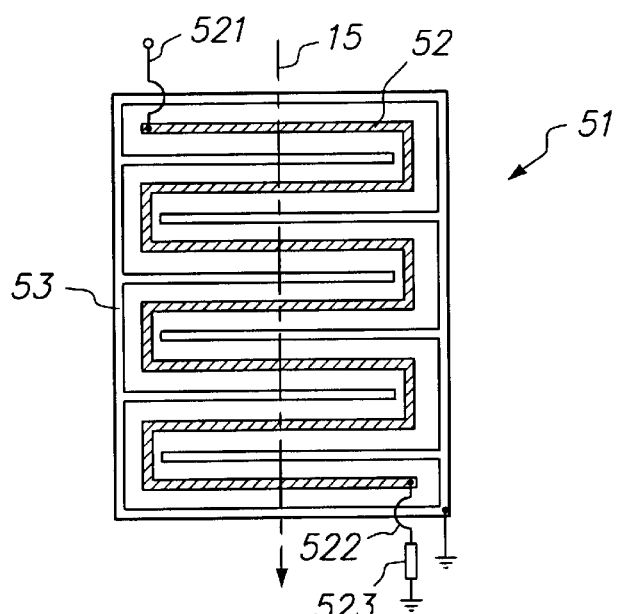
FIG. 3 shows a beam blanker deflector plate of another type in the prior art with a meandering track.
Figure 4:
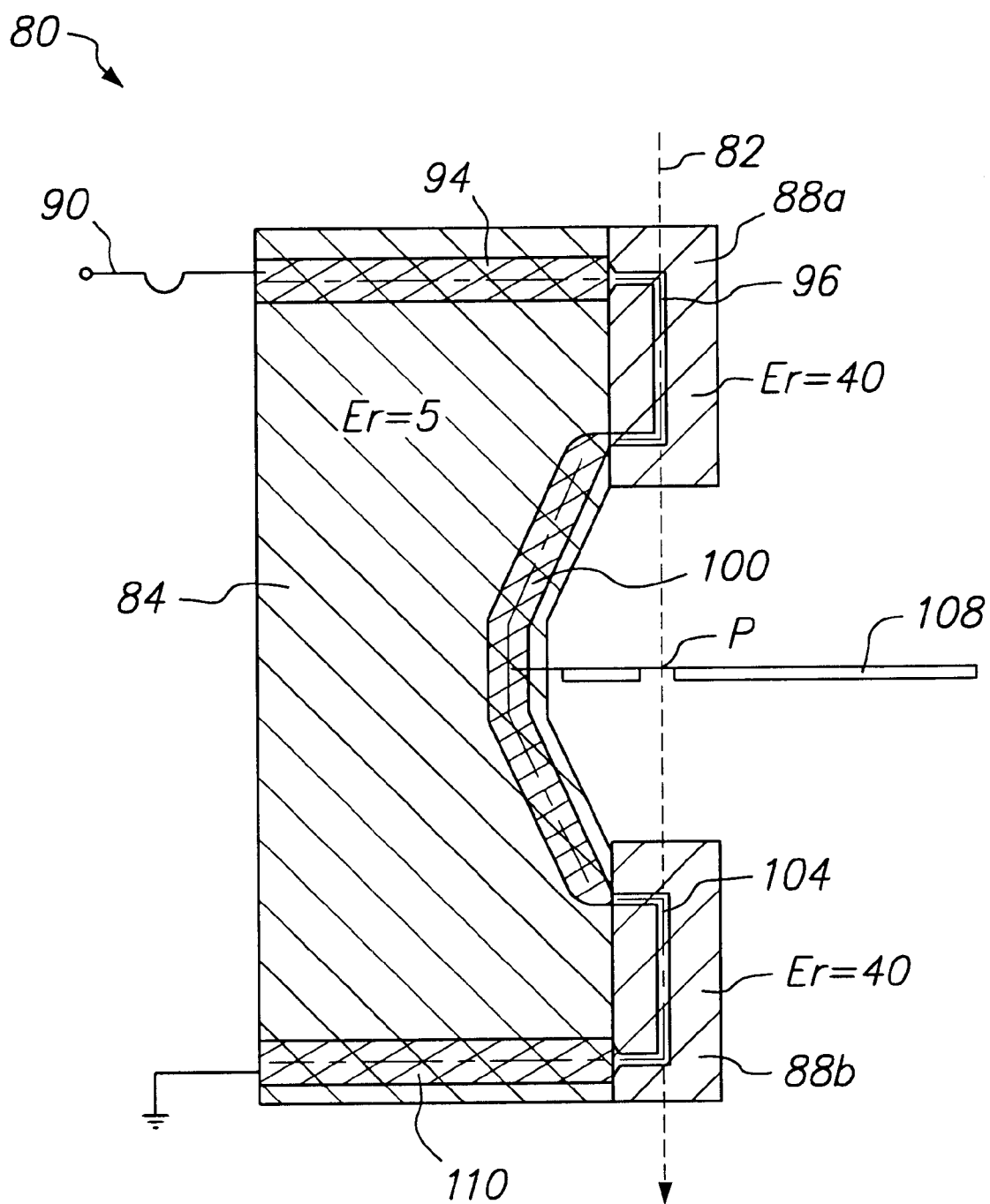
FIG. 4 shows a blanker deflector plate in accordance with this disclosure.

As described above, the present beam blanker assembly is intended for use in electron beam column. The view of the beam a blanker deflector plate used in that assembly, FIG. 4, is essentially the same as that of FIG. 3; that is, FIG. 4 is a view of a single deflector plate 80. The electron beam axis is the broken line 82 which passes by the deflector plate 80. The other deflector plate of the pair in the beam blanker assembly would be on the other side of the electron beam 82 so that the two deflector plates face each other and are spaced apart by an appropriate distance, for instance, 0.09 inch for passage therebetween of the electron 82. Hence in the FIG. 4 view, the other deflector plate would not be visible. Deflector plate 80 exhibits a variation of the characteristic U shape of the deflector plate of Gesley, U.S. Pat. No. 5,276,300 mentioned above; plate 80 is less curved than is the Gesley structure Plate 80 does not rely on the exaggerated horseshoe type curve for the delay line as used in Kelly. Instead, the delay is provided largely by the choice of material. The physical structure of plate 80 includes a body 84 of a suitable dielectric material. Here the relative dielectric constant Er of this material is shown as being equal to five; this is a design parameter as will be explained below. There are machineable ceramics (e.g., Macor) which have a dielectric constant in the suitable range.

The deflection regions 88a and 88b of plate 80 are formed of a different substrate material having a higher dielectric constant Er, in this example shown as being 40. Regions 88a, 88b have a high dielectric constant because these regions perform the actual beam deflection and hence must slow the blanking wave down to match the electron beam velocity. In one embodiment, deflection regions 88a and 88b are small structures of a different ceramic substrate which is suitably adhered to body 84. For instance, this adhesion is by epoxy bonding. (It is to be understood that metal fasteners are to be avoided.) Alternatively, plate 80 is of a single monolithic piece of ceramic or other suitable material in which the end portions 88a and 88b are suitably formed so as to have a higher dielectric constant. This requires suitable ceramic or other manufacturing capability.

Electrically conductive portions of plate 80 include the blanking signal input terminal 90 (which is conventional and shown only schematically) which connects to a gold film region 94 on the surface of the body 84. Region 94 is for input of the blanking signal and is of a width and thickness so as to serve as a waveguide for the input blanking signal. Region 94 is typically formed by deposition of a thin film gold film on the dielectric substrate body 84. Region 94 connects to the electrode 96 of the first deflection region 88a and is a much narrower region of gold film. (The cross-hatching indicates the electrically conductive regions which in this case of the gold film.)

Electrically connected to the electrode 96 is the connection region 100 which includes a thin deposited gold film having approximately the same thickness and width as region 94 and which follows the illustrated curve of the substrate body 84. Connection region 100 electrically connects to the lower deflection electrode 104 which is similar to electrode 96 and is part of the lower deflection region 88b. Thus structures 88b and 104 define the lower deflection region which is electrically connected to the upper deflection region 88a by the connection region 100. Note that in this embodiment the electrically conductive regions are formed only on the visible surface of plate 80, and not on the rear (not visible) surface. Electrically coupled to the lower deflection electrode 104 is the output electrode 110 (also a thin gold film) which is shown schematically electrically connected to a ground terminal.

The blanking signal is slowed down in regions 88a, 88b to match the electron beam velocity of, e.g., 0.41c by the high dielectric constant of the substrate material (where c is the speed of light). The calculation of the wave propagation velocity is complicated by the fact that most of the electromagnetic field is in the vacuum region between the two deflector plates while some penetrates the high dielectric material at the plates. By solving for the fields, the effects of the surrounding vacuum and the high dielectric material can be properly averaged. Such a calculation shows that 40 is the approximate dielectric constant needed to achieve 0.41c wave velocity. (A typical electron beam having a 50 KeV accelerating energy propagates in a vacuum at 0.41c). As well known, the velocity of an electric signal in a dielectric material is $c/\sqrt{Er}$ where Er is the relative dielectric constant. Here, since the relative dielectric constant Er is 5, the velocity of the electric signal (wave) in region 100 is equal to 0.4c. The curvature in region 100 also provides some additional delay by extending the wave path length. The plate width is part of this calculation. Since materials with dielectric constant greater than 40 may not be readily available, the conductive regions are narrowed in one embodiment in regions 88a, 88b.

Between the high dielectric beam deflection regions, the blanking signal wave is propagated by conductor 100 on a low dielectric constant substrate 84. In this region, the wave velocity is intended to be greater than the electron beam velocity so that the waveguide 100 can be directed away from the path of beam 82 as shown, yet still arrive at the lower deflection region in synchronism with the beam.

As seen in this case, the electron beam 82 is not being deflected and is passing through the aperture in blanking stop 108. If the blanking signal was being provided, this would deflect the electron beam 82 so that instead it would impact on the solid part of stop 108 and thereby not pass through the aperture therein. The rocking point mentioned above is at P where beam 82 passes through the aperture in beam stop 108. The goal is that beam 82 is deflected equally by the two deflection regions 88a, 88b so that the blanking signal propagated along the conductors shown in FIG. 4 arrives at the lower deflection region 88b at the same time as does the electron beam 82. Of course when this reference to the electron beam actually refers to a particular electron or electrons which is a part of the electron beam, since the electron beam (upstream of the blanker) is a continuous flow of electrons.

Thus when the beam 82 is deflected equally by the upper and lower deflection regions 88a, 88b, the beam appears to rock about point P. Since the downstream objective lens is focused on point P, this means that the rocking does not cause a shifting of the beam impingement position at the target, thus providing optimum exposure definition.

Thus it is seen that the actual dimensions and dielectric constants of the deflector plates in the beam blanker assembly are selected according to the beam propagation energy which determines the beam velocity. Hence no particular dimensions are provided in FIG. 4 since this is illustrative of a number of cases. However, for a 50 KeV electron beam, a typical distance between a center point of electrode 96 and a center point of electrode 104 is 55 millimeters.

It is to be understood of course that the supporting structures in the electron beam column for the deflector plate of FIG. 4 are not shown but would be of the conventional type. The same is true of its electrical connection to the source of the blanking signal.

This disclosure is illustrative but not limiting; further modifications will be apparent to one skilled in the art in light of this disclosure and are intended to fall within the scope of the appended claims.

We claim:

1. A blanker assembly for use in a column for a charged particle beam, the blanker assembly comprising:

first and second deflector plates arranged adjacent the charged particle beam, each deflector plate including:
a terminal for coupling a blanking signal to the plate;
a first deflection region electrically coupled to the terminal, the first deflection region including a conductive layer on a dielectric substrate;
a second deflection region including a conductive layer on a dielectric substrate;
a connection region electrically coupling the first deflection region to the second deflection region and including a conductive layer on a dielectric substrate having a dielectric constant less than that of the dielectric substrate of the first and second deflection regions, thereby to delay arrival of the blanking signal at the second deflection region.

2. The assembly of claim 1, wherein the connection region includes a curved portion lying between the first and second deflection regions, the curved portion in its center curving away from an axis of the charged particle beam.

3. The assembly of claim 1, wherein the dielectric constant of the dielectric substrate of the connection region is less than 1/5 that of the dielectric constant of the dielectric substrate of the first and second deflection regions.

4. The assembly of claim 1, wherein the substrates are of a ceramic and the conductive regions are of metal.

5. The assembly of claim 2, further comprising a blanking stop defining an aperture for passage of the charged particle beam, the blanking stop lying in a plane perpendicular to an axis defined by the charged particle beam and arranged adjacent a central portion of each of the first and second deflector plates.

6. The assembly of claim 1, wherein the dielectric constants are respectively 40 and 5.

7. The blanker assembly of claim 1, wherein a width of the conductive layer in the connection region is greater than a width of the conductive layer in the first and second deflection regions.

8. A method of blanking a charged particle beam by deflecting the beam away from an aperture, comprising the acts of:

providing a blanking signal at a first deflection region, thereby to deflect the beam;

transmitting the blanking signal to a second deflection region spaced apart, along an axis of the beam, from the first deflection region; and propagating the blanking signal through a dielectric material between the first and second deflection regions thereby to achieve continuous in-phase deflection of the beam by the blanking signal.

\* \* \* \* \*